(12) United States Patent
Lee et al.

(10) Patent No.: US 8,194,458 B2
(45) Date of Patent: Jun. 5, 2012

(54) PROGRAMMING AND/OR ERASING A MEMORY DEVICE IN RESPONSE TO ITS PROGRAM AND/OR ERASE HISTORY

(75) Inventors: June Lee, San Jose, CA (US); Fred Jaffin, III, Gilroy, CA (US)

(73) Assignee: Micron Technology, Inc., Boise, ID (US)

( * ) Notice: Subject to any disclaimer, the term of this patent is extended or adjusted under 35 U.S.C. 154(b) by 154 days.

(21) Appl. No.: 12/724,790

(22) Filed: Mar. 16, 2010

(65) Prior Publication Data

US 2010/0172186 A1 Jul. 8, 2010

Related U.S. Application Data

(62) Division of application No. 11/739,732, filed on Apr. 25, 2007, now Pat. No. 7,679,961.

(51) Int. Cl.
*G11C 11/34* (2006.01)

(52) U.S. Cl. ......... 365/185.19; 365/185.18; 365/185.33; 365/185.29

(58) Field of Classification Search ............ 365/185.18, 365/185.19, 185.33, 185.29
See application file for complete search history.

(56) References Cited

U.S. PATENT DOCUMENTS

| | | | |
|---|---|---|---|
| 6,005,810 A | 12/1999 | Wu | |
| 6,205,055 B1 | 3/2001 | Parker | |
| 6,278,633 B1 | 8/2001 | Wong et al. | |
| 6,327,183 B1 * | 12/2001 | Pawletko et al. | ........ 365/185.18 |
| 6,665,214 B1 | 12/2003 | Cheah et al. | |
| 7,085,341 B2 | 8/2006 | Wells | |
| 7,200,708 B1 | 4/2007 | Kreifels | |
| 2005/0024978 A1 | 2/2005 | Ronen | |
| 2006/0164886 A1 * | 7/2006 | Tanaka et al. | ............ 365/185.11 |
| 2008/0151619 A1 * | 6/2008 | Melik-Martirosian | .... 365/185.3 |

FOREIGN PATENT DOCUMENTS

WO   WO 2005/010638   2/2005

* cited by examiner

*Primary Examiner* — Fernando Hidalgo
(74) *Attorney, Agent, or Firm* — Leffert, Jay & Polglaze, P.A.

(57) ABSTRACT

For one embodiment, a program starting voltage of one or more program pulses applied to one or more memory cells is in response, at least in part, to on a number of program pulses previously required to program the one or more memory cells and/or an erase starting voltage of one or more erase pulses applied to one or more memory cells is based on a number of erase pulses previously required to erase the one or more memory cells. For another embodiment, a program starting voltage level and/or an erase starting voltage level of one or more program and/or erase pulses applied to one or more memory cells is in response, at least in part, to a number of program/erase cycles previously applied to the one or more memory cells.

17 Claims, 8 Drawing Sheets

US 8,194,458 B2

PROGRAMMING AND/OR ERASING A MEMORY DEVICE IN RESPONSE TO ITS PROGRAM AND/OR ERASE HISTORY

RELATED APPLICATION

This is a divisional application of application Ser. No. 11/739,732, titled "PROGRAMMING AND/OR ERASING A MEMORY DEVICE IN RESPONSE TO ITS PROGRAM AND/OR ERASE HISTORY," filed Apr. 25, 2007 and issued as U.S. Pat. No. 7,679,961 on Mar. 16, 2010, which application is assigned to the assignee of the present invention and the entire contents of which are incorporated herein by reference.

FIELD

The present disclosure relates generally to memory devices and in particular the present disclosure relates to programming and/or erasing a memory device in response, at least in part, to its program and/or erase history.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of charge storage or trapping layers or other physical phenomena, determine the data value of each cell. Common uses for flash memory include personal computers, personal digital assistants (PDAs), digital cameras, digital media players, cellular telephones, and removable memory modules.

A NAND flash memory device is a common type of flash memory device, so called for the logical form in which the basic memory cell configuration is arranged. Typically, the array of memory cells for NAND flash memory devices is arranged such that the control gate of each memory cell of a row of the array is connected to a word line. Columns of the array include strings (often termed NAND strings) of memory cells connected together in series, source to drain, between a pair of select lines, a source select line and a drain select line. The source select line includes a source select gate at each intersection between a NAND string and the source select line, and the drain select line includes a drain select gate at each intersection between a NAND string and the drain select line. The select gates are typically field-effect transistors. Each source select gate is connected to a source line, while each drain select gate is connected to a column bit line.

The memory array is accessed by a row decoder activating a row of memory cells by selecting the word line connected to a control gate of a memory cell. In addition, the word lines connected to the control gates of unselected memory cells of each string are driven to operate the unselected memory cells of each string as pass transistors, so that they pass current in a manner that is unrestricted by their stored data values. Current then flows from the column bit line to the source line through each NAND string via the corresponding select gates, restricted only by the selected memory cells of each string. This places the current-encoded data values of the row of selected memory cells on the column bit lines.

For some applications, flash memory uses a single bit per cell. Each cell is characterized by a specific threshold voltage, which is sometimes referred to herein as a Vt level. Within each cell, two or more possible Vt levels exist. These Vt levels are controlled by the amount of charge that is stored on the floating gate. For some NAND architectures, for example, a memory cell might have a Vt level greater than zero in a programmed (or logic zero) state and a Vt level less than zero in an erase state. As used herein, a program Vt refers to a Vt level of a memory cell in a programmed state, and an erase Vt refers to a Vt level of a memory cell in an erase state.

Memory cells are typically programmed using program/erase cycles, e.g., where such a cycle might involve first erasing a memory cell and then programming the memory cell. For a NAND array, a block of memory cells is typically erased by grounding all of the word lines in the block and applying an erase voltage to a semiconductor substrate on which the memory cells are formed, and thus to the channels of the memory cells, to remove the charge from the floating gates. More specifically, the charge is removed through Fowler-Nordheim tunneling of electrons from the floating gate to the channel, resulting in an erase Vt typically less than zero.

Programming typically involves applying a programming voltage to one or more selected word lines and thus to the control gate of each memory cell in communication with (e.g., electrically coupled to) the one or more selected word lines, regardless of whether a memory cell is targeted or untargeted for programming. While the programming voltage is applied to the one or more selected word lines, a potential, such as a ground potential, is applied to the substrate, and thus to the channels of these memory cells, to charge the floating gates. More specifically, the floating gates are charged through Fowler-Nordheim tunneling of electrons from the channel to the floating gate, resulting in a program Vt typically greater than zero.

For the reasons stated herein, and for other reasons which will become apparent to those skilled in the art upon reading and understanding the present specification, there is a need in the art for alternative program and erase schemes.

DETAILED DESCRIPTION

In the following detailed description of the present embodiments, reference is made to the accompanying drawings that form a part hereof. These embodiments are described in sufficient detail to enable those skilled in the art to practice disclosed subject matter, and it is to be understood that other embodiments may be utilized and that process, electrical or mechanical changes may be made without departing from the scope of the claimed subject matter. The following detailed description is, therefore, not to be taken in a limiting sense, and the scope of the claimed subject matter is defined only by the appended claims and equivalents thereof.

Figure 1:
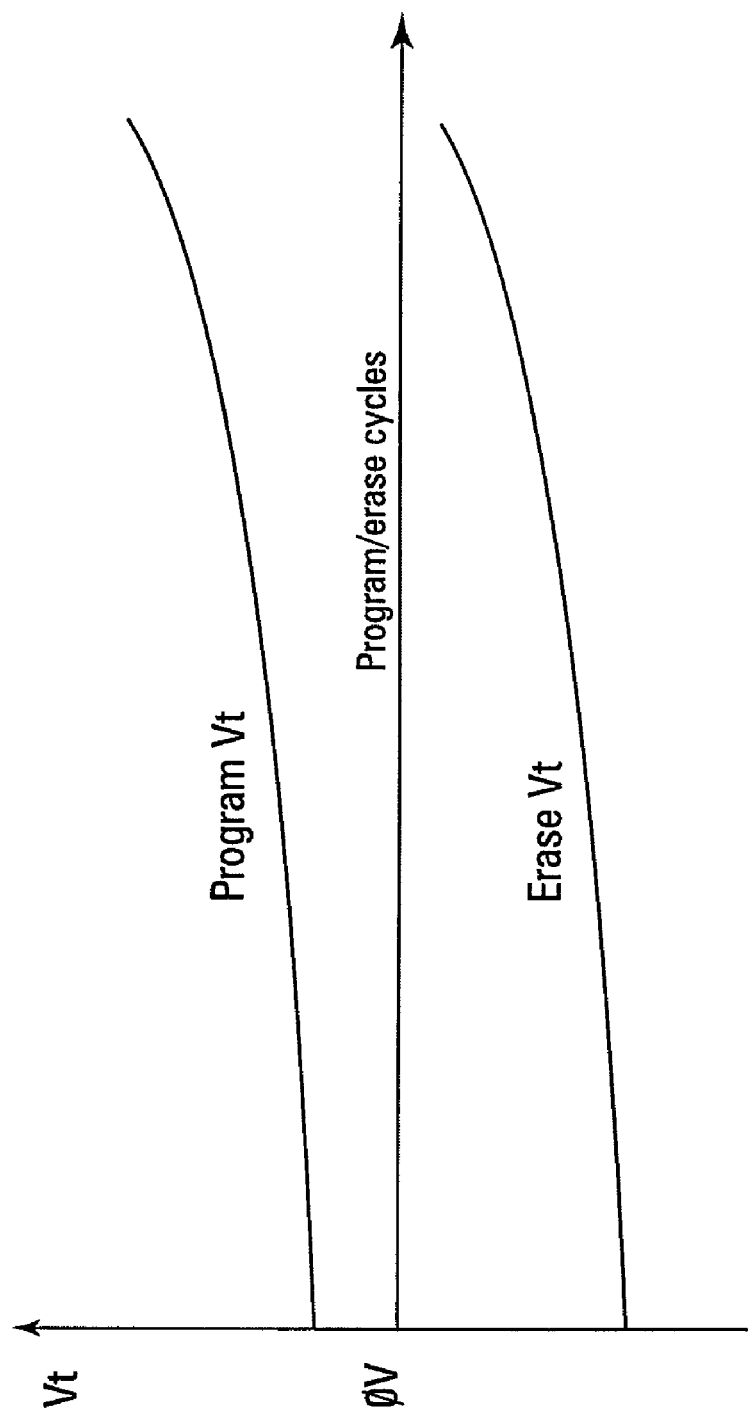
FIG. 1 shows an example plot of a sometimes referred to herein as program Vt of a typical flash memory cell for a given program voltage and pulse width versus the number of program/erase cycles applied to the flash memory cell and an example plot of an erase Vt of a typical flash memory cell for a given erase voltage and pulse width versus the number of program/erase cycles applied to the flash memory cell.

The mechanism for both programming and erasing memory cells results in the passage of electrons though a tunnel dielectric layer, e.g., a tunnel oxide layer, interposed between the substrate on which the memory cells are formed and the floating gates of the memory cells, and therefore, electrons can become trapped in the oxide layer. As the number of program/erase cycles increases, an increasing number of electrons become trapped in the oxide layer. The trapped electrons act to increase the charge on the floating gates and thus the program Vt and the erase Vt of the memory cells. Therefore, the program Vt and the erase Vt increase as the number of program/erase cycles increases, as shown in FIG. 1. As the program Vt and the erase Vt increase with the number of program/erase cycles, the erase voltage applied to the substrate for erasing the memory cells should be increased to properly erase all the memory cells, and the programming voltage applied to the word lines should be decreased to avoid over programming the memory cells.

The programming operation typically involves applying, to selected word lines, a number of programming pulses that start at a predetermined starting voltage level, typically insufficient to program all of the targeted memory cells of the selected word lines, and that are incremented until all of the targeted memory cells of the selected word lines are programmed. If the predetermined starting voltage provides for efficient programming when the memory device is new, it may lead to over-programming of some memory cells whose program Vt has increased too much through multiple program/erase cycles. However, if a predetermined starting voltage is chosen to avoid over-programming of memory cells later in the device life-cycle, it will generally lead to inefficient programming when the device is new as an excessive amount of program pulses will be required to program the memory cells.

One or more selected memory cells are typically erased by applying one or more erase pulses having the same or differing (e.g., successively incremented) voltage levels to the substrate while the word line(s) in communication with the one or more selected memory cells are grounded. However, as the number of program/erase cycles increases, it becomes more difficult to erase the memory cells in that the erase threshold voltage increases as the number of program/erase cycles increases. If the erase voltage provides for efficient erase operations when the memory device is new, it will generally lead to inefficient erase operations later in the device life-cycle. For example, an excessive amount of erase pulses will be required to erase the memory cells whose erase Vt has increased too much through multiple program/erase cycles. However, if the erase voltage is chosen to avoid excessive erase pulses later in the device life-cycle, it may lead to over-erasure of memory cells when the device is new.

Figure 2A:
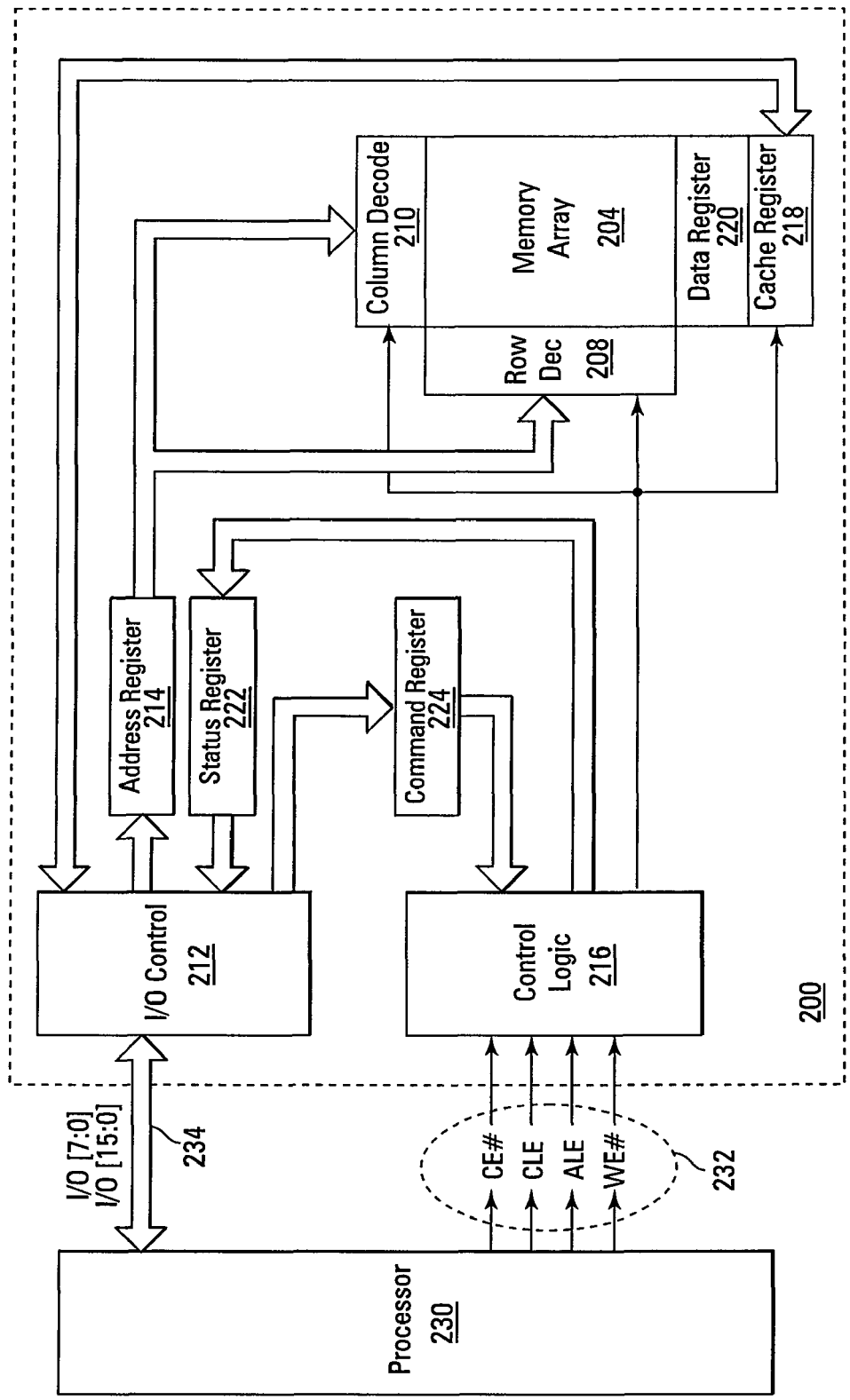
FIG. 2A is a simplified block diagram of an embodiment of a NAND flash memory device, according to an embodiment of the disclosure.

FIG. 2A is a simplified block diagram of a NAND flash memory device 200 in communication with a processor 230 as part of an electronic system, according to an embodiment. The processor 230 may be a memory controller or other external host device. Memory device 200 includes an array of memory cells 204 arranged in rows and columns. A row decoder 208 and a column decoder 210 are provided to decode address signals. Address signals are received and decoded to access memory array 204.

Memory device 200 also includes input/output (I/O) control circuitry 212 to manage input of commands, addresses and data to the memory device 200 as well as output of data and status information from the memory device 200. An address register 214 is in communication with I/O control circuitry 212, and row decoder 208 and column decoder 210 to latch the address signals prior to decoding. A command register 224 is in communication with I/O control circuitry 212 and control logic 216 to latch incoming commands. Control logic 216 controls access to the memory array 204 in response to the commands and generates status information for the external processor 230. The control logic 216 is in communication with row decoder 208 and column decoder 210 to control the row decoder 208 and column decoder 210 in response to the addresses.

Control logic 216 is also in communication with a cache register 218. Cache register 218 latches data, either incoming or outgoing, as directed by control logic 216 to temporarily store data while the memory array 204 is busy writing or reading, respectively, other data. For one embodiment, control logic 216 may include one or more circuits adapted to produce a particular and predictable outcome or set of outcomes in response to one or more input events. During a write operation, data is passed from the cache register 218 to data register 220 for transfer to the memory array 204; then new data is latched in the cache register 218 from the I/O control circuitry 212. During a read operation, data is passed from the cache register 218 to the I/O control circuitry 212 for output to the external processor 230; then new data is passed from the data register 220 to the cache register 218. A status register 222 is in communication with I/O control circuitry 212 and control logic 216 to latch the status information for output to the processor 230.

In accordance with one embodiment of the disclosure, control logic 216 is configured to monitor pulse counts and/or program/erase cycles, and to adjust a program starting voltage and/or to adjust an erase starting voltage in response, at least in part, to the pulse counts and/or cycles.

Memory device 200 receives control signals at control logic 216 from processor 230 over a control link 232. The control signals may include at least chip enable CE#, a command latch enable CLE, an address latch enable ALE, and a write enable WE#. Memory device 200 receives command signals (which represent commands), address signals (which represent addresses), and data signals (which represent data) from processor 230 over a multiplexed input/output (I/O) bus 234 and outputs data to processor 230 over I/O bus 234.

For example, the commands are received over input/output (I/O) pins [0:7] of I/O bus 234 at I/O control circuitry 212 and are written into command register 224. The addresses are received over input/output (I/O) pins [0:7] of bus 234 at I/O control circuitry 212 and are written into address register 214.

The data are received over input/output (I/O) pins [0:7] for an 8-bit device or input/output (I/O) pins [0:15] for a 16-bit device at I/O control circuitry 212 and are written into cache register 218. The data are subsequently written into data register 220 for programming memory array 204. For another embodiment, cache register 218 may be omitted, and the data are written directly into data register 220. Data are also output over input/output (I/O) pins [0:7] for an 8-bit device or input/output (I/O) pins [0:15] for a 16-bit device.

It will be appreciated by those skilled in the art that additional circuitry and signals can be provided, and that the memory device of FIG. 2A has been simplified to help focus on the invention. It should be recognized that the functionality of the various block components described with reference to FIG. 2A may not be segregated to distinct components or component portions of an integrated circuit device. For example, a single component or component portion of an integrated circuit device could be adapted to perform the functionality of more than one block component of FIG. 2A. Alternatively, one or more components or component portions of an integrated circuit device could be combined to perform the functionality of a single block component of FIG. 2A.

Additionally, while specific I/O pins are described in accordance with popular conventions for receipt and output of the various signals, it is noted that other combinations or numbers of I/O pins may be used in the various embodiments.

Figure 2B:
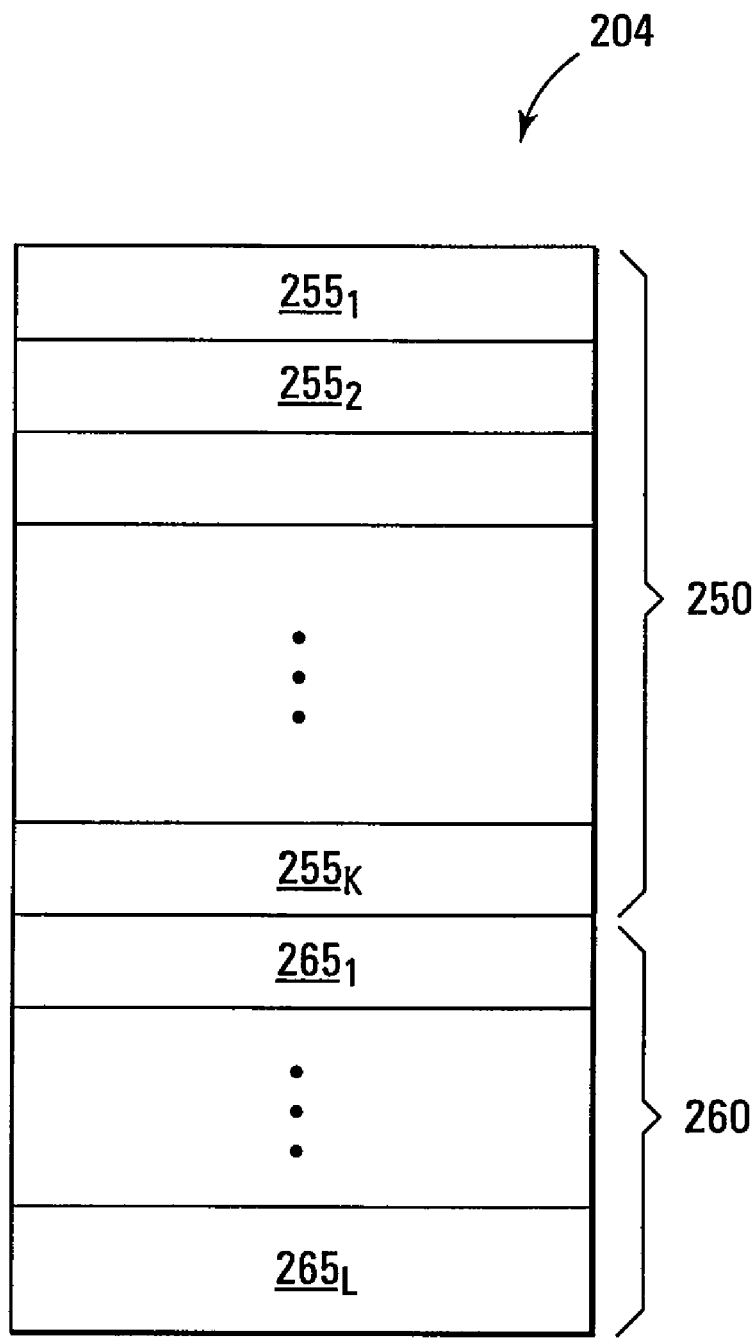
FIG. 2B illustrates an embodiment of a memory array, according to another embodiment of the disclosure.

FIG. 2B illustrates memory array 204, according to another embodiment. For one embodiment, memory array 204 has a primary array 250 with primary memory blocks $255_1$ to $255_K$ and a secondary memory array 260 with secondary memory blocks $265_1$ to $265_L$. For another embodiment, one or more of secondary memory blocks 265 are redundant memory blocks for replacing one or more defective primary memory blocks. One or more of secondary memory blocks 265 may store a number of program/erase cycles applied to one or more memory cells, such as a block of primary memory cells, in accordance with embodiments of the disclosure.

Figure 3:
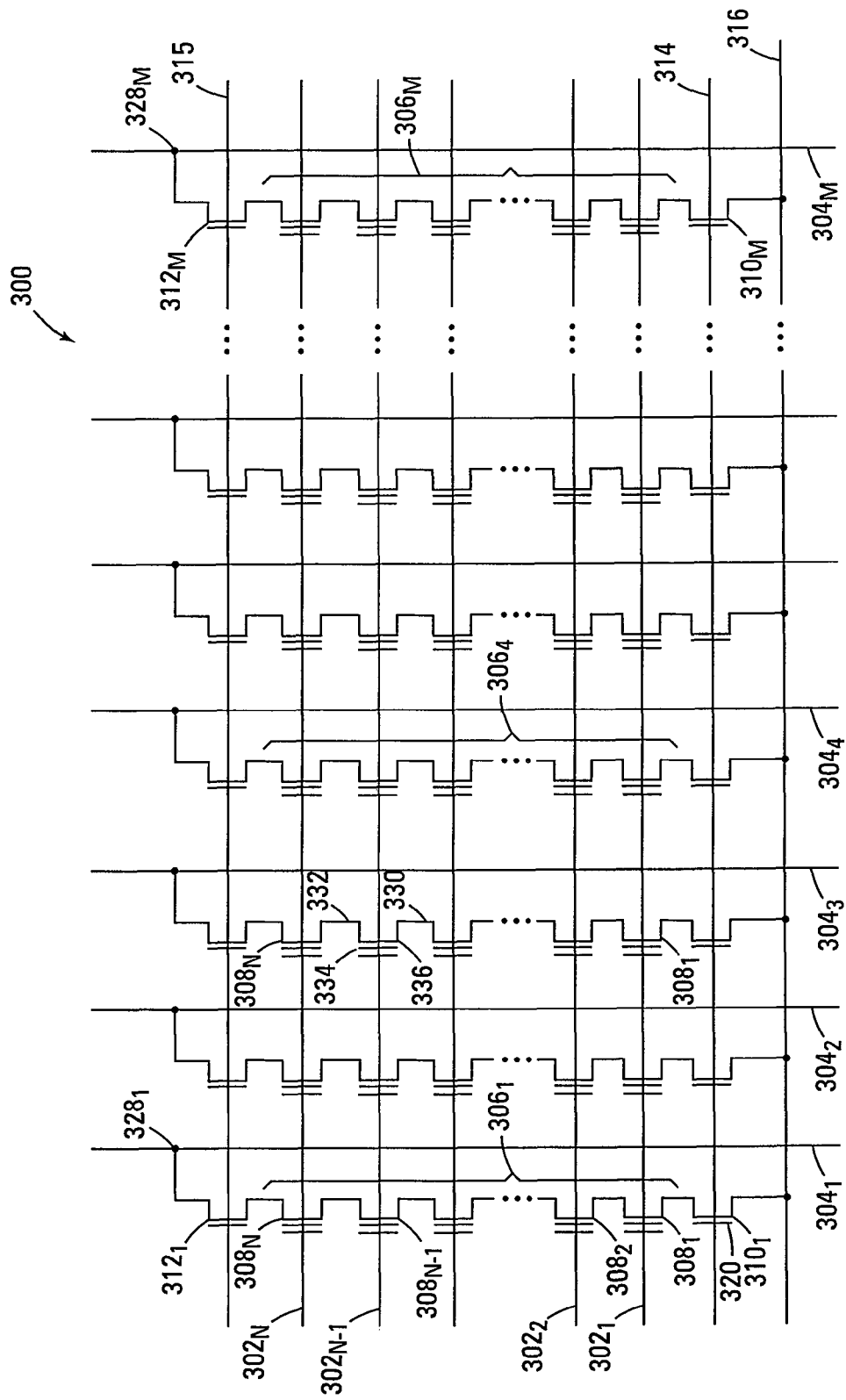
FIG. 3 illustrates an embodiment of a NAND memory array in accordance with another embodiment of the disclosure.

FIG. 3 illustrates a NAND memory array 300 as a portion of memory array 204, such as a primary memory block 255 or a secondary memory block 265, in accordance with another embodiment. As shown in FIG. 3, the memory array 300 includes word lines $302_1$ to $302_N$ and intersecting local bit lines $304_1$ to $304_M$. For ease of addressing in the digital environment, the number of word lines 302 and the number of bit lines 304 are each some power of two, e.g., 256 word lines 302 by 4,096 bit lines 304.

Memory array 300 includes NAND strings $306_1$ to $306_m$. Each NAND string includes floating gate transistors $308_1$ to $308_N$, each located at an intersection of a word line 302 and a local bit line 304. The floating gate transistors 308 represent non-volatile memory cells for storage of data. The floating gate transistors 308 of each NAND string 306 are connected in series, source to drain, between a source select gate 310, e.g., a field effect transistor (FET), and a drain select gate 312, e.g., an FET. Each source select gate 310 is located at an intersection of a local bit line 304 and a source select line 314, while each drain select gate 312 is located at an intersection of a local bit line 304 and a drain select line 315.

A source of each source select gate 310 is connected to a common source line 316. The drain of each source select gate 310 is connected to the source of the first floating gate transistor 308 of the corresponding NAND string 306. For example, the drain of source select gate $310_1$ is connected to the source of floating gate transistor $308_1$ of the corresponding NAND string $306_1$. A control gate 320 of each source select gate 310 is connected to source select line 314. It is common for a common source line to be connected between source select gates for NAND strings of two different NAND arrays. As such, the two NAND arrays share the common source line.

The drain of each drain select gate 312 is connected to the local bit line 304 for the corresponding NAND string at a drain contact 328. For example, the drain of drain select gate $312_1$ is connected to the local bit line $304_1$ for the corresponding NAND string $306_1$ at drain contact $328_1$. The source of each drain select gate 312 is connected to the drain of the last floating gate transistor $308_N$ of the corresponding NAND string 306. For example, the source of drain select gate $312_1$ is connected to the drain of floating gate transistor $308_N$ of the corresponding NAND string $306_1$. It is common for two NAND strings to share the same drain contact.

Typical construction of floating gate transistors 308 includes a source 330 and a drain 332, a floating gate 334, and a control gate 336, as shown in FIG. 3. Floating gate transistors 308 have their control gates 336 coupled to a word line 302. A column of the floating gate transistors 308 is a NAND string 306 coupled to a given local bit line 304. A row of the floating gate transistors 308 are those transistors commonly coupled to a given word line 302.

Figure 4:
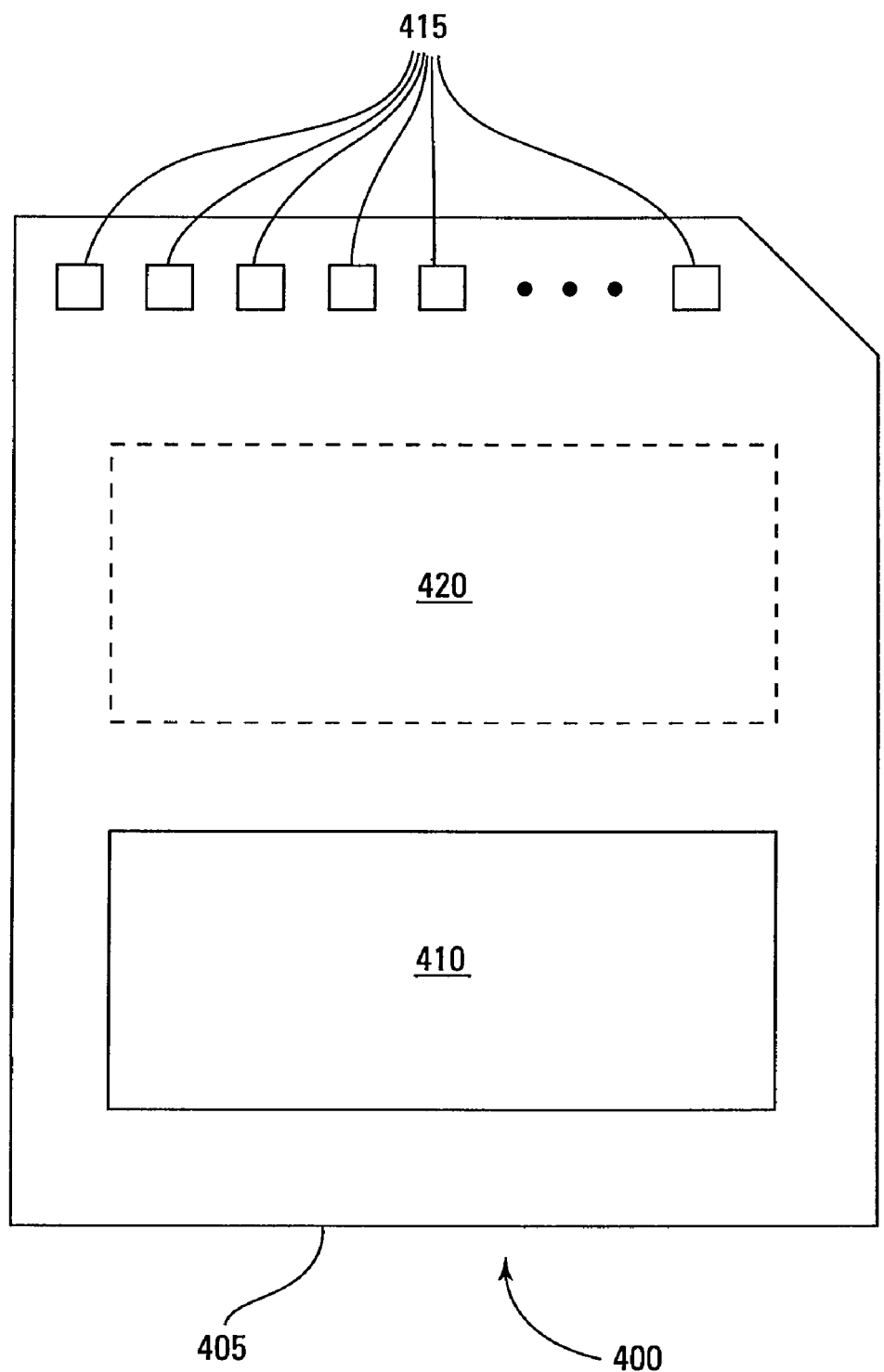
FIG. 4 is an illustration of an embodiment of a memory module, according to another embodiment of the disclosure.

FIG. 4 is an illustration of a memory module 400, according to another embodiment. Memory module 400 is illustrated as a memory card, although the concepts discussed with reference to memory module 400 are applicable to other types of removable or portable memory, e.g., USB flash drives, and are intended to be within the scope of "memory module" as used herein. In addition, although one example form factor is depicted in FIG. 4, these concepts are applicable to other form factors as well.

In some embodiments, memory module 400 will include a housing 405 (as depicted) to enclose one or more memory devices 410, though such a housing is not essential to all devices or device applications. At least one memory device 410 is a non-volatile memory having control logic configured in accordance with embodiments of the invention, e.g., as described above in conjunction with FIG. 2A for control logic 216.

Where present, the housing 405 includes one or more contacts 415 for communication with a host device. Examples of host devices include digital cameras, digital recording and playback devices, PDAs, personal computers, memory card readers, interface hubs and the like. For some embodiments, the contacts 415 are in the form of a standardized interface. For example, with a USB flash drive, the contacts 415 might be in the form of a USB Type-A male connector. In general, however, contacts 415 provide an interface for passing command, address and/or data signals between the memory module 400 and a host having compatible receptors for the contacts 415.

The memory module 400 may optionally include additional circuitry 420 which may be one or more integrated circuits and/or discrete components. For some embodiments, the additional circuitry 420 may include a memory controller for controlling access across multiple memory devices 410 and/or for providing a translation layer between an external host and a memory device 410. For example, there may not be a one-to-one correspondence between the number of contacts 415 and a number of I/O connections to the one or more memory devices 410. Thus, a memory controller could selectively couple an I/O connection (not shown in FIG. 4) of a memory device 410 to receive the appropriate signal at the appropriate I/O connection at the appropriate time or to provide the appropriate signal at the appropriate contact 415 at the appropriate time. Similarly, the communication protocol between a host and the memory module 400 may be different than what is required for access of a memory device 410. A memory controller could then translate the command signal (s) received from a host into the appropriate command signal (s) to achieve the desired access to the memory device 410. Such translation may include changes in signal voltage levels and/or multiplexing or demultiplexing to command signals, for example.

The additional circuitry 420 may also include functionality unrelated to control of a memory device 410, such as logic functions as might be performed by an ASIC (application specific integrated circuit). Also, the additional circuitry 420 may include circuitry to restrict read or write access to the memory module 400, such as password protection, biometrics or the like. The additional circuitry 420 may include circuitry to indicate a status of the memory module 400. For example, the additional circuitry 420 may include functionality to determine whether power is being supplied to the memory module 400 and whether the memory module 400 is currently being accessed, and to display an indication of its status, such as a solid light while powered and a flashing light while being accessed. The additional circuitry 420 may further include passive devices, such as decoupling capacitors to help regulate power requirements within the memory module 400.

Figure 5:
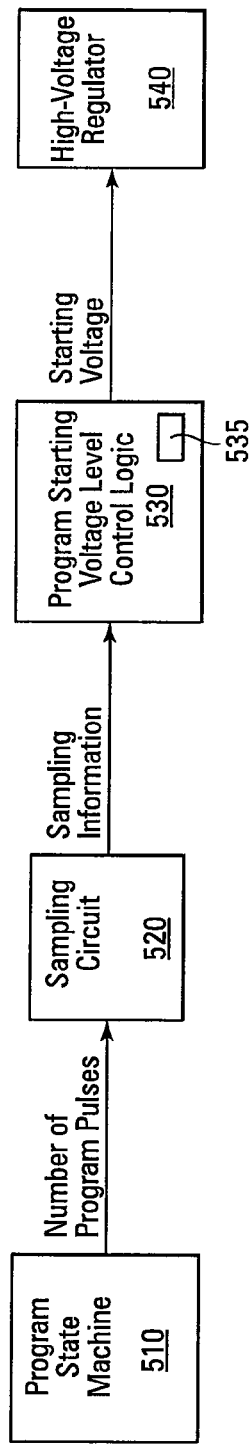
FIG. 5 illustrates an embodiment of a portion of control logic of an embodiment of a memory device, according to another embodiment of the disclosure.
Figure 6:
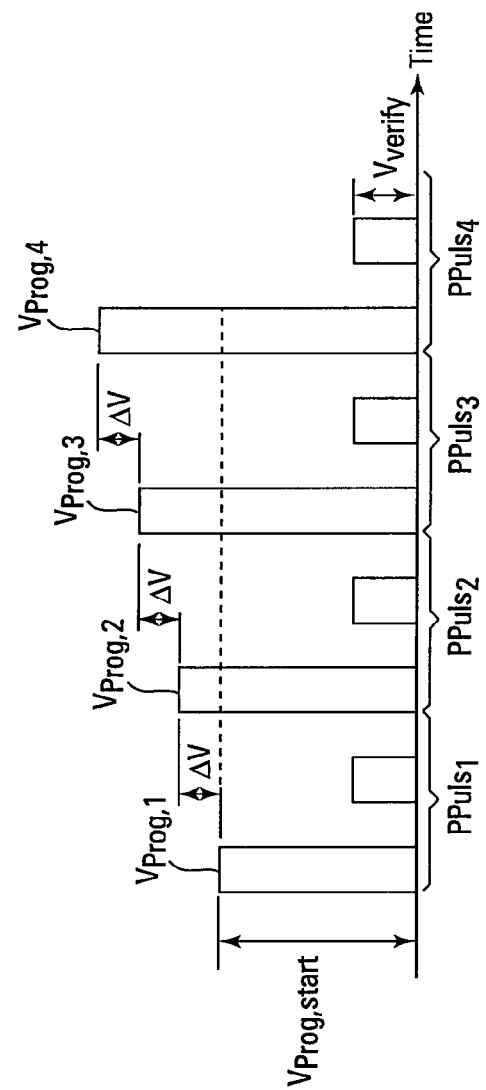
FIG. 6 illustrates a series of program pulses typically used to program one or more memory cells.

FIG. 5 illustrates a portion of control logic 216 of memory device 200 of FIG. 2, according to another embodiment. A program state machine 510 controls the programming of one or more target memory cells of memory array 204. Program state machine 510 determines the number of program pulses ppuls (FIG. 6) it takes to program one or more target memory cells, e.g., corresponding to a page of memory cells, of a selected word line, to which the program pulses ppuls are applied. For one embodiment, applying a program pulse ppuls to a selected word line includes applying a programming voltage $V_{prog}$ to the selected word line, followed by applying a program verify voltage $V_{verify}$ to the selected word line, as shown in FIG. 6.

For one embodiment, programming starts by applying a programming voltage $V_{prog}$, e.g., $V_{prog,1}$, having a program starting voltage level $V_{prog,start}$ to the selected word line. If the program verify indicates that one or more of the target memory cells are programmed, the programming is completed for those memory cells. If any of the target memory cells remain unprogrammed, the programming voltage $V_{prog,1}$ is increased from the program starting voltage level $V_{prog,start}$ by a program voltage step $\Delta V$, resulting in a programming voltage $V_{prog,2}=V_{prog,1}+\Delta V$ at the selected word line, as shown in FIG. 6. These remaining unprogrammed target memory cells then receive an additional programming pulse while programmed target memory cells and other memory cells associated with the word line are inhibited from programming. If the program verify indicates that one or more of the remaining target memory cells are now programmed, the programming is completed for those memory cells. This sequence is repeated, e.g., using program pulses $V_{prog,3}$ and $V_{prog,4}$, until all of the target memory cells are programmed, i.e., until the target memory cells are at least at their desired program Vt.

Subsequently, programming may proceed to other memory cells of the selected word line that correspond to another page, or programming may proceed to another word line of the same memory block or another memory block. Note that hereinafter, unless specified otherwise, a memory block may be a primary memory block 255 (FIG. 2B) or a secondary memory block 265 that can or is being used as a redundant memory block to replace a defective primary memory block.

An erase operation is typically performed on a block of memory cells before they are programmed. An erase operation followed by a programming operation, such as described above, constitutes an exemplary program/erase cycle. Note that the program Vt, for a given program voltage and pulse width, generally increases as the number of program/erase cycles increases, as shown in FIG. 1. This means that for a given program starting voltage level $V_{prog,start}$, the number of program pulses ppuls it takes to program one or more target memory cells may decrease as the number of program/erase cycles increases.

A sampling circuit 520 is in communication with program state machine 510, as shown in FIG. 5. For one embodiment, sampling circuit 520 determines the number of program pulses ppuls it takes to program a certain (e.g., a predetermined) number (or a sample) of memory cells a certain number of times after power-up. For another embodiment, sampling circuit 520 may gather and hold the number of program pulses ppuls it takes to program this "sample." For one embodiment, this "sample" may include one or more targeted memory cells from each of a plurality of word lines, such as a memory block of word lines, a single page of memory cells, etc. For another embodiment, the number of program pulses ppuls it takes to program the sample may be determined each time the sample is programmed. For another embodiment, sampling circuit 520 determines the number of program pulses ppuls it takes to program a sample of memory cells corresponding to each page of memory cells each time that page of memory cells is programmed.

Logic 530 for controlling the program starting voltage level $V_{prog,start}$ is in communication with sampling circuit 520, as shown in FIG. 5. For one embodiment, logic 530 includes a volatile or non-volatile latch 535 that stores the sampling information, e.g., the number of program pulses ppuls it takes to program a sample of memory cells, from sampling circuit 520. Note that for some embodiments, e.g., where each sample of memory cells corresponds to a single page of memory cells and where the pages are programmed a single page at a time, sampling circuit 520 may be omitted. For such embodiments, the number of pulses required to program that page may be stored directly in latch 535 after that page is programmed. For one embodiment, logic 530 determines the average number of program pulses ppuls it takes to program one or more memory cells of each selected word line of a sample, e.g., where the sample includes one or more memory cells of each of a plurality of word lines, and stores the average in latch 535; thus, the average is an average per word line.

For one embodiment, logic 530 compares the number of program pulses ppuls determined by sample circuit 520, or determined by program state machine 510, or an average number of program pulses ppuls per word line, as determined by logic 530, to a target number of programming pulses that may be stored by or preprogrammed in logic 530. When the number of program pulses ppuls is different than the target number of programming pulses, logic 530 may adjust a program starting voltage level $V_{prog,start}$ so that the number of program pulses ppuls applied during the next program operation will tend toward the target number of programming pulses. For example, if the number of program pulses ppuls is greater than the target number of programming pulses, logic 530 may increase the program starting voltage level $V_{prog,start}$ to reduce the number of program pulses ppuls applied during the next program operation. For another embodiment, logic 530 may store the difference between the target number of programming pulses and the number of program pulses ppuls in latch 535, e.g., when latch 535 is a non-volatile latch. For a further embodiment, logic 530 may only adjust the program starting voltage level $V_{prog,start}$ when the number of program pulses ppuls exceeds the target number of programming pulses by some number greater than one.

A high-voltage regulator 540 is in communication with logic 530. For one embodiment, a trim of high-voltage regulator 540 for setting the program starting voltage is set to the program starting voltage level $V_{prog,start}$ from logic 530.

Figure 7:
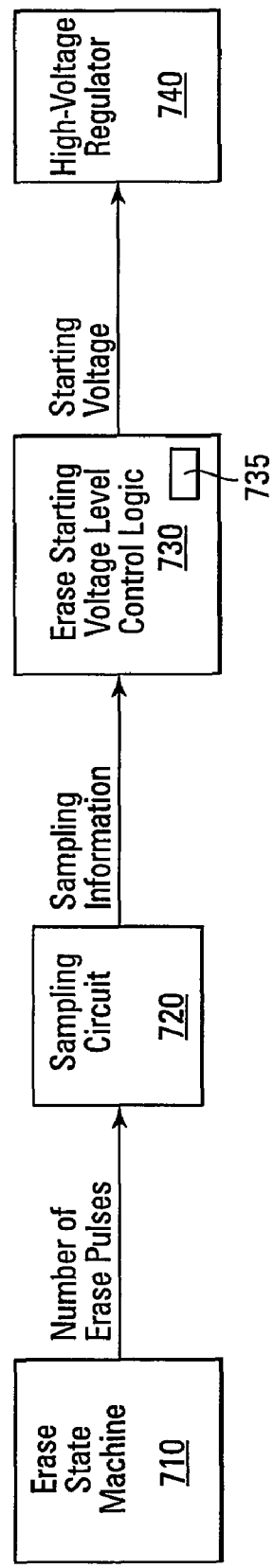
FIG. 7 illustrates an embodiment of a portion of control logic of an embodiment of a memory device, according to another embodiment of the disclosure.

FIG. 7 illustrates a portion of control logic 216 of memory device 200 of FIG. 2, according to another embodiment. An erase state machine 710 controls erasing of one or more target memory cells of memory array 204. For one embodiment, erase state machine 710 erases one or more target memory cells prior to programming the one or more memory cells. For another embodiment, erase state machine 710 erases the memory cells a block at a time. Erase state machine 710 determines the number of erase pulses it takes to erase one or more target memory cells of a selected word line, e.g., to which ground is applied. For one embodiment, applying an erase pulse includes applying an erase voltage (e.g., a negative voltage), followed by an erase-verify operation that determines whether the target memory cells have been erased.

For one embodiment, erasing starts by applying an erase voltage having an erase starting voltage level to the substrate. If the erase verify indicates that each of the one or more target memory cells is erased, the erase is completed. Otherwise, the erase voltage is increased (e.g., negatively or in magnitude) from the erase starting voltage level by an erase voltage step. If the subsequent erase verify indicates that each of the one or more target memory cells is erased, the erase is completed. Otherwise, the erase voltage is again increased by the erase voltage step followed by an erase verify. This is repeated until each of the one or more target memory cells is erased, i.e., until the target memory cells are at least at their desired erase Vt.

Note that the erase Vt generally increases (e.g., becomes less negative) for a given erase voltage and pulse width as the number of program/erase cycles increases, as shown in FIG. 1. This means that for a given erase starting voltage level, the number of erase pulses it takes to erase one or more target memory cells generally increases as the number of program/erase cycles increases.

A sampling circuit 720 is in communication with erase state machine 710, as shown in FIG. 7. For one embodiment, sampling circuit 720 determines the number of erase pulses it takes to erase a certain number (or sample) of memory cells a certain number of times after power-up. For another embodiment, sampling circuit 720 may gather and hold the number of erase pulses it takes to program this "sample." For one embodiment, this "sample" may include one or more targeted memory cells from each of a plurality of word lines, such as a memory block of word lines. For another embodiment, the number of erase pulses it takes to erase the sample may be determined each time the sample is erased. For another embodiment, sampling circuit 720 determines the number of erase pulses it takes to erase a sample of memory cells corresponding to a block of memory cells each time that block of memory cells is erased.

Logic 730 for controlling the erase starting voltage level is in communication with sampling circuit 720, as shown in FIG. 7. For one embodiment, logic 730 includes a volatile or non-volatile latch 735 that stores the sampling information, e.g., the number of erase pulses it takes to erase a sample of memory cells, from sampling circuit 720. Note that for some embodiments, e.g., where each sample of memory cells corresponds to a block of memory cells and where the blocks are erased a single block at a time, sampling circuit 720 may be omitted. For such embodiments, the number of pulses required to erase that block may be stored directly in latch 735 after that block is erased. For one embodiment, logic 730 determines the average number of erase pulses it takes to erase one or more memory cells of each selected word line of a sample, e.g., where the sample includes one or more memory cells of each of a plurality of word lines, and stores the average in latch 735; thus, the average is an average per word line.

For one embodiment, logic 730 compares the number of erase pulses determined by sample circuit 720, or directly from erase state machine 710, or an average number of erase pulses per word line, determined by logic 730, to a target number of erase pulses that may be stored by or preprogrammed in logic 730. When the number of erase pulses is different than the target number of erase pulses, logic 730 may adjust an erase starting voltage level so that the number of erase pulses applied during the next erase operation will tend toward the target number of erase pulses. For example, if the number of erase pulses is more than the target number of erase pulses, logic 730 may increase the erase starting voltage level (e.g., negatively or the magnitude of the erase starting voltage level) to reduce the number of erase pulses applied during the next erase operation. For another embodiment, logic 730 may store the difference between the target number of programming pulses and the number of erase pulses, e.g., when latch 735 is a non-volatile latch. For a further embodiment, logic 730 may only adjust the erase starting voltage level when the number of erase pulses exceeds the target number of erase pulses by some number greater than one.

A high-voltage regulator 740 is in communication with logic 730. For one embodiment, a trim of high-voltage regulator 740 for setting the erase starting voltage is set to the erase starting voltage level from logic 730.

Figure 8:
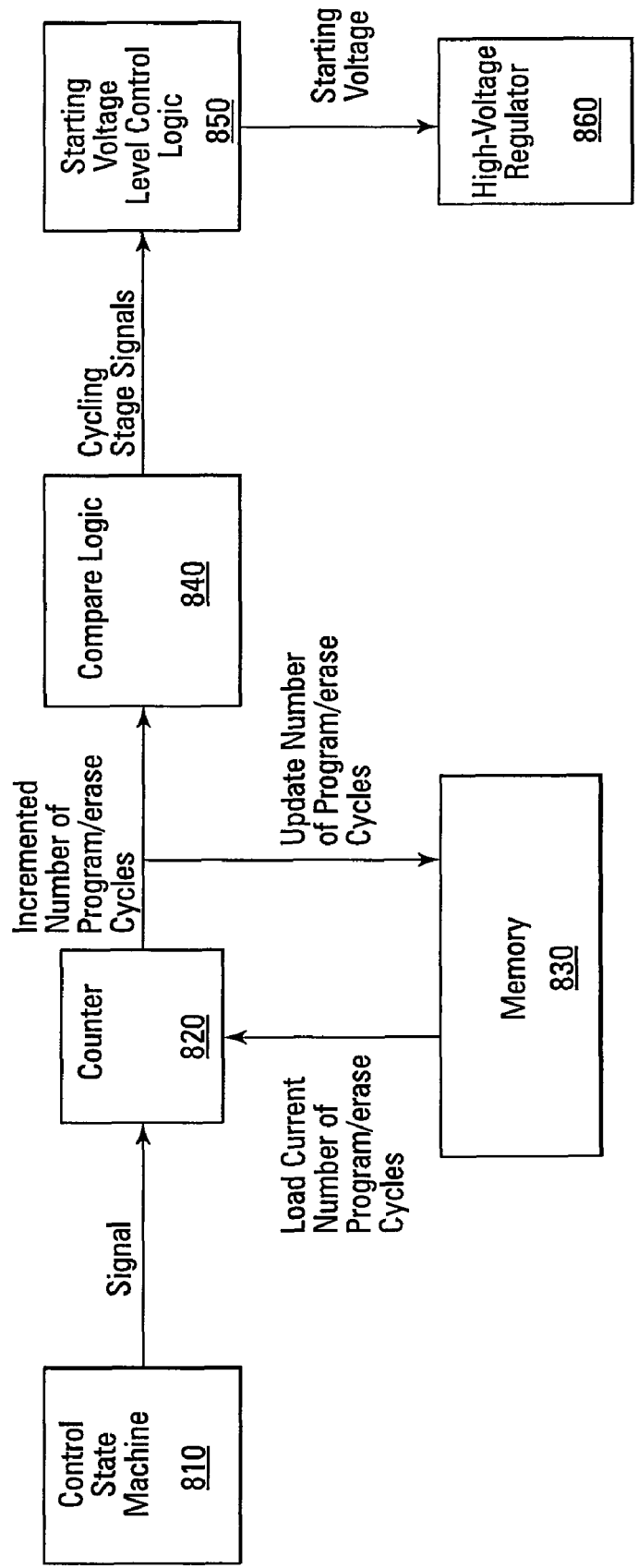
FIG. 8 illustrates an embodiment of a portion of control logic of an embodiment of a memory device, according to another embodiment of the disclosure.

FIG. 8 illustrates a portion of control logic 216 of memory device 200 of FIG. 2, according to another embodiment. A control state machine 810 controls the programming and/or erasing of one or more target memory cells of one or more memory blocks of memory array 204. For one embodiment, control state machine 810 erases one or more target memory cells prior to programming the one or more memory cells. For another embodiment, control state machine 810 erases the memory cells a block at a time prior to programming one or more target memory cells of the corresponding erased block.

A counter 820 is in communication with control state machine 810 and a memory 830. For one embodiment, memory 830 is a portion of secondary memory array 260 of FIG. 2B, such as one or more NAND strings of memory cells of one of secondary memory blocks 265 (FIG. 2B). For one embodiment, memory 830 may store the number of program/erase cycles applied to the memory cells of each memory block. For other embodiments, the number of program/erase cycles applied to the memory cells of the respective memory blocks may be substantially the same, and thus, memory 830 stores a nominal number of program/erase cycles, e.g., per memory block. For one embodiment, counter 820 is reset upon power-up and is then loaded with the number of program/erase cycles previously stored in memory 830, e.g., as part of an initialization sequence of the memory device.

Each time control state machine 810 performs a programming operation and/or erase operation, by programming and/or erasing one or more target memory cells, control state machine 810 sends a signal, indicative that a program/erase cycle has occurred, to counter 820, and counter 820 then increments the current counter value (i.e., the number of program/erase cycles) by one. For one embodiment, the signal is in the form of a clock pulse that causes counter 820 to count up by one.

Compare logic 840 is in communication with counter 820, as shown in FIG. 8. Counter 820 outputs the incremented number of program/erase cycles to compare logic 840. Compare logic 840 compares the incremented number of program/erase cycles to one or more numerical values. For one embodiment, the one or more numerical values may be part of a look-up table of compare logic 840.

Compare logic 840 is in communication with starting-voltage control logic 850 for controlling the program starting voltage level $V_{prog,start}$, described above in conjunction with FIGS. 5 and 6, and/or the erase starting voltage level, described above in conjunction with FIG. 7, as shown in FIG. 8. Compare logic 840 outputs cycling stage signals to starting-voltage control logic 850 in response, at least in part, to the comparison of the determined number of program/erase cycles to the one or more numerical values. Starting-voltage control logic 850 then adjusts the program starting voltage level and/or the erase starting voltage level in response to the cycling stage signals from compare logic 840. For example, when the incremented number of program/erase cycles is less than a first numerical value, starting-voltage control logic 850 sets the program starting voltage level to a first program level and/or the erase starting voltage level to a first erase level in response to the cycling stage signals from compare logic 840. When the incremented number of program/erase cycles is greater than or equal to the first numerical value and less than a second numerical value, starting-voltage control logic 850 sets the program starting voltage level to a second program level and/or the erase starting voltage level to a second erase level, for example, in response to the cycling stage signals from compare logic 840. The comparisons may continue until the incremented number of program/erase cycles exceeds a maximum numerical value.

For one embodiment, the program starting voltage level may be set so that a certain number of programming pulses is applied to one or more selected word lines, and/or the erase starting voltage level is set so that a certain number of erase pulses is applied to the substrate on which the memory cells are formed. For another embodiment, the program starting voltage level and/or the erase starting voltage level are adjusted so that the number of programming pulses and/or the number of erase pulses remain substantially fixed, regardless of the number of program/erase cycles. For example, the number programming pulses may correspond to the number of programming pulses required to program one or more memory cells after a large number of program/erase cycles has occurred, and/or the number of erase pulses may correspond to the number of erase pulses required to erase one or more memory cells after a large number of program/erase cycles has occurred. Therefore, since the required number of programming pulses generally decreases as the number of program/erase cycles increases and the required number of erase pulses generally increases as the number of program/erase cycles increases, the program starting voltage level would need to decrease and the erase starting voltage level would need to increase as the number of program/erase cycles increases to keep the number of programming and erase pulses fixed.

A high-voltage regulator 860 is coupled to starting-voltage control logic 850. For one embodiment, a trim of high-voltage regulator 860 for setting the program starting voltage and/or the erase starting voltage are set to the program starting voltage level and the erase starting voltage level from starting-voltage control logic 850.

The incremented number of program/erase cycles output from counter 820 is stored in memory 830, thereby updating the number of program/erase cycles stored in memory 830. For one embodiment, the output of counter 820 may be stored in memory 830 upon power-down of the memory device.

CONCLUSION

Although specific embodiments have been illustrated and described herein it is manifestly intended that the scope of the claimed subject matter be limited only by the following claims and equivalents thereof.

What is claimed is:

1. A method of erasing a memory device, comprising:
   erasing one or more memory cells during an erase operation;
   determining, internal to the memory device, a number of erase pulses required to erase a sample of the one or more memory cells erased during the erase operation; and
   adjusting an erase starting voltage level of one or more erase pulses applied to the one or more memory cells during a subsequent erase operation in response, at least in part, to the number of erase pulses required to erase the sample of the one or more memory cells erased during the prior erase operation;
   wherein the sample of the one or more memory cells erased during the prior erase operation is erased during the subsequent erase operation.

2. The method of claim 1, wherein adjusting the erase starting voltage level of one or more erase pulses applied to the one or more memory cells during a subsequent erase operation comprises adjusting the erase starting voltage level so that the number of erase pulses applied during the subsequent erase operation will tend toward a target number of erase pulses.

3. The method of claim 2, wherein the target number is less than the number of erase pulses determined in the prior erase operation.

4. The method of claim 1, wherein determining a number of erase pulses required to erase the sample of the one or more memory cells erased during the prior erase operation comprises determining an average number of erase pulses it takes to erase the sample of the one or more memory cells erased during the prior erase operation and/or determining the number of erase pulses it takes to erase the sample of the one or more memory cells erased during the prior erase operation a certain number of times after power-up.

5. The method of claim 1, wherein adjusting an erase starting voltage level of one or more erase pulses applied to the one or more memory cells during a subsequent erase operation is in response to the number of erase pulses required to erase the sample of the one or more memory cells erased during the prior erase operation exceeding a certain number of erase pulses and/or exceeding the certain number of erase pulses by more than one.

6. The method of claim 1, further comprising storing the number of erase pulses required to erase the sample of the one or more memory cells erased during the prior erase operation.

7. The method of claim 1, further comprising determining, internal to the memory device, a number of erase pulses required to erase a sample of the one or more memory cells erased during each time an erase operation is performed.

8. A method of erasing a memory device, comprising:
   determining, internal to the memory device, a number of erase pulses required for erasing a sample of memory cells of the memory device during an erase operation;

comparing the determined number of erase pulses required for erasing the sample of memory cells of the memory device to a target number of erase pulses; and adjusting an erase starting voltage level of one or more erase pulses applied to one or more memory cells of the sample of memory cells during a subsequent erase operation when the determined number of erase pulses required for erasing the sample of memory cells in the prior erase operation is different than the target number so that the number of erase pulses applied during the subsequent erase operation tends toward the target number.

9. The method of claim 8, wherein adjusting the erase starting voltage level of the one or more erase pulses applied to the one or more memory cells of the sample of memory cells during the subsequent erase operation comprises adjusting the erase starting voltage level of the one or more erase pulses applied to the one or more memory cells of the sample of memory cells during the subsequent erase operation to reduce the number of erase pulses applied to the one or more memory cells of the sample of memory cells during the subsequent erase operation when the determined number of erase pulses required for erasing the sample of memory cells in the prior erase operation exceeds the target number.

10. A memory device, comprising:
a memory array;
a state machine configured to control erase operations on the memory array and to determine a number of erase pulses required to erase one or more memory cells of the memory array;
starting-voltage level control logic coupled to the state machine, the starting-voltage level control logic configured to adjust an erase starting voltage level of one or more erase pulses applied to one or more memory cells during an erase operation in response, at least in part, to a number of erase pulses required for erasing one or more memory cells during a previous erase operation; and
a sampling circuit in communication with the starting-voltage level control logic and the state machine, the sampling circuit configured to determine a number of erase pulses it takes to erase a sample of one or more memory cells, wherein the sample of erased memory cells includes the one or more memory cells erased during the previous erase operation.

11. The memory device of claim 10, wherein the starting-voltage level control logic is configured to determine an average number of erase pulses it takes to erase the sample of erased memory cells.

12. The memory device of claim 10, wherein the starting-voltage level control logic comprises a latch configured to store the number of erase pulses required for erasing the one or more memory cells erased during the previous erase operation.

13. The memory device of claim 10, wherein the one or more memory cells erased during the previous erase operation include the one or more memory cells to which the one or more erase pulses with the adjusted erase starting voltage level are being applied.

14. The memory device of claim 10, wherein the one or more memory cells erased during the previous erase operation do not include the one or more memory cells to which the one or more erase pulses with the adjusted erase starting voltage level are being applied.

15. The memory device of claim 10, wherein the starting-voltage level control logic is further configured to compare the number of erase pulses required for erasing the one or more memory cells erased during the previous erase operation to a target number of erase pulses.

16. The memory device of claim 15, wherein the starting-voltage level control logic is further configured to adjust the erase starting voltage level of the one or more erase pulses when the number of erase pulses required for erasing the one or more memory cells erased during the previous erase operation exceeds the target number of erase pulses by some number greater than one.

17. The memory device of claim 10, further comprising a high-voltage regulator coupled to the starting-voltage level control logic for receiving the erase starting voltage level of the one or more erase pulses from the starting-voltage level control logic, wherein a trim of the high-voltage regulator is configured to be set to an erase starting voltage in response to the erase starting voltage level of the one or more erase pulses received from the starting-voltage level control logic.

* * * * *